(12) United States Patent
Mashino

(10) Patent No.: US 6,670,269 B2
(45) Date of Patent: Dec. 30, 2003

(54) METHOD OF FORMING THROUGH-HOLE OR RECESS IN SILICON SUBSTRATE

(75) Inventor: Naohiro Mashino, Nagano (JP)

(73) Assignee: Shinko Electric Industries Co., LTD, Nagano (JP)

( * ) Notice: Subject to any disclaimer, the term of this patent is extended or adjusted under 35 U.S.C. 154(b) by 0 days.

(21) Appl. No.: 10/266,730

(22) Filed: Oct. 8, 2002

(65) Prior Publication Data

US 2003/0073299 A1 Apr. 17, 2003

(30) Foreign Application Priority Data

Oct. 15, 2001 (JP) .................................. 2001-316762

(51) Int. Cl.[7] .................... H01L 21/44; H01L 21/4763; B23K 26/00
(52) U.S. Cl. .................. 438/637; 438/107; 438/115; 438/122; 438/455; 438/745
(58) Field of Search ................... 438/74, 107, 109, 438/115, 122, 455, 637, 745; 219/121.6, 121.7, 121.71; 134/1.2, 1.3

(56) References Cited

U.S. PATENT DOCUMENTS

| | | | |
|---|---|---|---|
| 5,493,096 A | * | 2/1996 | Koh |
| 5,646,067 A | * | 7/1997 | Gaul |
| 6,245,596 B1 | * | 6/2001 | Kosaki et al. |
| 6,429,096 B1 | * | 8/2002 | Yanagida |
| 6,566,232 B1 | * | 5/2003 | Hara et al. |
| 2002/0038908 A1 | * | 4/2002 | Ding et al. |
| 2003/0058630 A1 | * | 3/2003 | Takano et al. |

FOREIGN PATENT DOCUMENTS

JP A-2001-94039 4/2001

OTHER PUBLICATIONS

USPAP 2002/0038908A1, Ding et al., Apr. 4, 2002.*
USPAP 2003/0058630 A1, Takano et al., Mar. 27, 2003.*

* cited by examiner

*Primary Examiner*—Ha Tran Nguyen
(74) *Attorney, Agent, or Firm*—Paul & Paul

(57) ABSTRACT

A method of forming a through-hole or a recess in a silicon substrate, having a conductor pattern formed on one side thereof by irradiating a laser beam to the silicon substrate, comprising the steps of: forming a protective film for protecting the conductor pattern on the one side of the silicon substrate, forming, on the entire surface of the silicon substrate inclusive of the top of the protective film, a metal plating film adhered to the protective film, irradiating a laser beam onto a predetermined position of the silicon substrate covered with the protective film and with the metal plating film, to form a through-hole or a recess in the silicon substrate, peeling off the metal plating film and removing debris, on the metal plating film around the open periphery of the through-hole or the recess, which has been deposited thereon during the formation of the thorough-hole or the recess by the laser beam irradiation, and removing a deposit, on the inner wall of the thorough-hole or the recess, which has been deposited thereon during the formation of the thorough-hole or the recess by the laser beam irradiation, by use of a removing solution not damaging the protective film.

13 Claims, 9 Drawing Sheets

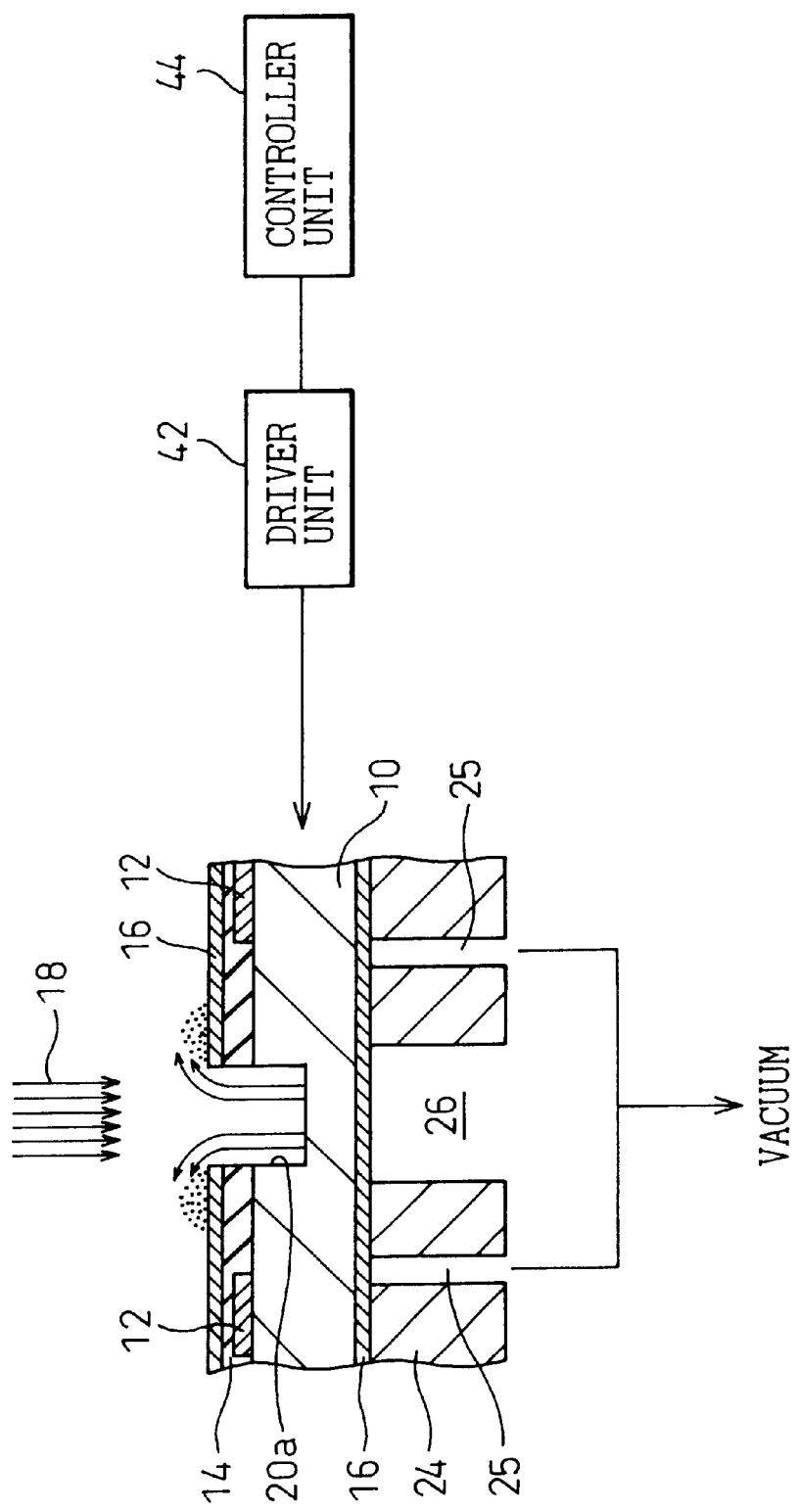

METHOD OF FORMING THROUGH-HOLE OR RECESS IN SILICON SUBSTRATE

BACKGROUND OF THE INVENTION

1. Field of the Invention

This invention relates to a method for forming holes in a silicon substrate. More particularly, the invention relates to a method, for forming holes in a silicon substrate, that irradiates a silicon substrate having a pattern formed on one of the surfaces thereof with a laser beam, and forms through-holes or recesses.

2. Description of the Related Art

The performance of electronic devices has become higher and their sizes have become smaller in recent years. Along with this trend, a so-called "multi-chip package (MCP)" as a semiconductor device in which a plurality of semiconductor chips is arranged in one package has been fabricated to improve the device performance and to reduce the device size. A three-dimensional MCP, shown in FIG. 7, in which a plurality of semiconductor chips is stacked in a direction of thickness, in particular, exhibits a greater contribution to miniaturization of electronic devices than a two-dimensional MCP in which a plurality of semiconductor chips is arranged in a planar direction, and has therefore been investigated vigorously (see, for example, Japanese Unexamined Patent Publication (Kokai) Nos. 2001-94039 and 10-163411).

In such a three-dimensional MCP, the semiconductor chips so stacked must be electrically connected to one another. To this end, a member called a "via" 102 is used to electrically connect the stacked semiconductor chips 100 with one another as shown in FIG. 7, which is more advantageous from the aspects of integration efficiency and mounting efficiency than the use of wires for electrically connecting the semiconductor chips 100 with one another. To electrically and mutually connect the semiconductor chips 100 through the via 102, as shown in FIG. 7, a through-hole 104 must be formed in the semiconductor chips 100. A method using plasma processing or a method using laser processing has been employed in the past to form a hole or holes, such as a through-hole for forming the via, in a substrate formed substantially of silicon used for the semiconductor chip 100.

Of these hole formation methods, the method using plasma processing can form a clean hole in the silicon substrate with extremely small amounts of debris adhering to an inner wall of a hole such as the through-hole. However, the hole formation method using plasma process is not free from the high cost of forming a hole such as the through-hole, and a hole formation method capable of forming a hole in a silicon substrate at a lower cost has therefore been required.

The method of forming a hole in the silicon substrate by laser processing can form a hole such as the through-hole in the silicon substrate at a lower cost compared to the method using plasma processing but cannot form a clean hole. When laser beams 204 are irradiated to a silicon substrate 200 that is held by a vacuum onto a stage 202 in the hole formation method using laser processing as shown in FIG. 8, a recess 206a formed in the silicon substrate 200 becomes gradually deeper and at last a through-hole 206 is formed in the silicon substrate 200. A deposit (laser dross) 208, as debris scattered from the silicon substrate 200 due to the irradiation of the laser beam 204 and deposited, exists at a portion in the proximity of the open periphery of the through-hole 206 thus formed on the irradiation side of the laser beam 204. In addition, the debris adheres to the inner wall of the through-hole 206 and to the surface of the silicon substrate facing the stage 202, as shown in FIG. 9.

When the laser dross 208 and the debris are left as such, they peel off the silicon substrate 200 in subsequent process steps, turn into foreign matter and are likely to invite a drop in reliability of the product. The laser dross 208 and the debris can be removed when the silicon substrate 200 is washed in a caustic potash (KOH) solution or the like, but a conductor pattern 210 formed on one side of the silicon substrate 200 is likely to be damaged during washing with the caustic potash solution. Also, when the laser beam forms the through-hole 206, heat is accumulated inside the silicon substrate 200 during the formation of the through-hole 206 and the conductor pattern 210 is likely to be thermally damaged. Therefore, a method of forming the holes in the silicon substrate using laser processing has not been industrially employed in the past.

However, in comparison with the hole formation method using plasma processing, the method of forming the holes in the substrate by laser processing can form the holes such as the through-hole at a lower cost. Therefore, if the heat dissipation property of the silicon substrate 200 can be improved during laser processing and if the laser dross 208 formed around the open periphery of the resulting hole such as the through-hole and the debris deposited on the inner wall of the hole can be easily cleaned, the hole formation method using laser processing could be advantageously used industrially.

SUMMARY OF THE INVENTION

It is therefore an object of the invention to provide a hole formation method of a silicon substrate by laser processing that can solve the problems described above, can improve heat dissipation property during processing and can easily clean the dross formed around an open periphery of the resulting holes, such as through-holes, and the debris deposited on the inner wall surface of the holes.

To solve the problems described above, the inventor first formed a protective film made of silicon oxide ($SiO_2$) stable to a caustic potash solution on a conductor pattern-formed surface of a silicon substrate, then formed a nickel (Ni) plating film on the entire surface of the silicon substrate inclusive of the upper surface of this protective film, and then irradiated a laser beam to thereby form through-holes. As a result, the inventor has found that possible damage of the conductor pattern by heat of laser processing can be eliminated, the through-holes formed by laser processing can be easily cleaned, and clean through-holes can be formed. The inventor has thus completed the invention.

According to an aspect of the invention, there is provided a method of forming a through-hole or a recess in a silicon substrate having a conductor pattern formed on one side thereof, by irradiating laser beam to the silicon substrate, comprising the steps of forming a protective film for protecting the conductor pattern on the one side (pattern formation side) of the silicon substrate, forming, on the entire surface of the silicon substrate inclusive of top of the protective film, a metal plating film adhered to the protective film, irradiating a laser beam to a predetermined position of the silicon substrate covered with the protective film and with the metal plating film, to form a through-hole or a recess in the silicon substrate, peeling the metal plating film and removing a deposit deposited on the metal plating film around the open periphery of the through-hole or the recess during the formation thereof by the laser beam irradiation, and removing a deposit, such as debris, deposited on the inner wall of the through-hole or the recess during the formation thereof by the laser beam irradiation, by use of a removing solution not damaging the protective film.

In the invention described above, a silicon oxide ($SiO_2$) film can be formed as the protective film, so as to allow it to be used also as an insulating film. When the nickel (Ni) plating film is formed as the metal plating film, adhesion with the silicon oxide ($SiO_2$) film as the protective film can be improved.

When a caustic potash (KOH) solution is used as the removing solution for removing the deposit on the inner wall of the through-hole or the recess, the deposit can be easily removed. A solution of NaOH or HF can also be used besides the KOH solution.

In the case where the laser beam is irradiated to serially form a plurality of through-holes or recesses in the silicon substrate, following the formation of a previous through-hole or recess, a subsequent through-hole or recess may be formed at a location on the substrate, the location being selected so that heat generated by the irradiation of the laser beam to the substrate for the formation of the previous through-hole or recess is not substantially accumulated in the substrate during the formation of the subsequent through-hole or recess. Alternatively, also following the formation of a previous through-hole or recess, a subsequent through-hole or recess may be formed at a time interval between the formations of the previous and subsequent through-holes or recesses, the time interval being selected so that heat generated by the irradiation of the laser beam onto the substrate for the formation of the previous through-hole or recess is not substantially accumulated in the substrate during the formation of the subsequent through-hole or recess. In this way, accumulation of heat in the silicon substrate due to the irradiation of laser beam can be prevented.

Also in the invention described above, the debris formed by the irradiation of the laser beam is reflected by the surface of the stage and is deposited on the silicon substrate at the point when the silicon substrate is put on the stage, and the laser beam is irradiated thereto and penetrates through the silicon substrate to create the through-hole. Using a stage having debris reflection-prevention means, however, it becomes possible to prevent the debris from being reflected by the surface of the stage and from depositing on the silicon substrate.

After a plurality of through-holes is formed in the silicon substrate, the debris within the through-holes can be removed by irradiating again the laser beam into the respective through-holes.

When the through-hole is formed in the silicon substrate, the amount of the laser dross formed on the pattern formation side of the silicon substrate can be reduced if the laser beam 18 is irradiated from the other side of the silicon substrate not having the conductor pattern to form the through-hole.

According to the invention, laser processing is conducted in the condition that the metal plating film is formed on the entire surface of the silicon substrate having the conductor pattern formed thereon. Therefore, the heat dissipation property of the silicon substrate can be improved, and heat generated during laser processing can be quickly dissipated from the silicon substrate. Consequently, possible thermal damage to the conductor pattern due to accumulation of heat in the silicon substrate during laser processing can be eliminated.

Since the metal plating film is peeled after laser processing, the deposit (laser dross, etc) formed in the proximity of the open periphery of the hole such as the through-hole during laser processing can be removed.

The protective film that is stable to the removing solution for removing the deposit deposited on the silicon substrate during laser processing protects the pattern formation surface of the silicon substrate. Therefore, when the silicon substrate is washed with the removing solution, after laser processing, to clean the inner wall of the through-hole or recess formed, possible damage of the conductor pattern on the silicon substrate can be eliminated.

As described above, the invention can improve the heat dissipation property of the silicon substrate during laser processing, can easily clean the laser dross deposited and built up to the portion near the open periphery of the through-hole or recess, formed by laser processing, as well as the debris deposited on the inner wall of the through-hole or recess, and can easily form a clean through-hole or recess through laser processing.

BRIEF DESCRIPTION OF THE DRAWINGS

The above and other objects and advantages of the invention will be well understood and appreciated by a person with ordinary kill in the art, from consideration of the following detailed description made by referring to the attached drawings, wherein:

FIG. 3 illustrates another embodiment of the method of forming through-holes in a silicon substrate;

DESCRIPTION OF THE PREFERRED EMBODIMENTS

FIG. 1 shows an embodiment of the method of forming a hole in silicon substrate according to the invention. This embodiment forms a through-hole in a silicon substrate.

Figure 1A:
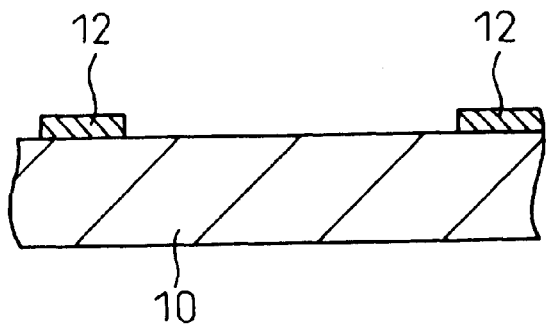
FIGS. 1A to 1K illustrate the method for forming a hole in a silicon substrate according to the invention.
Figure 1B:
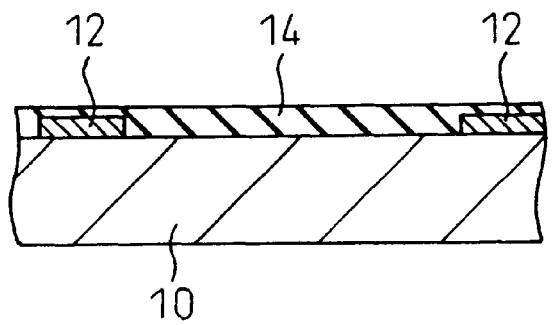

To begin with, a silicon oxide ($SiO_2$) film 14 is formed as a protective film on a side (conductor pattern formation side) of a silicon substrate 10 on which a conductor pattern 12 is formed (FIGS. 1A and 1B). This $SiO_2$ film 14 can be formed on the pattern formation side of the silicon substrate 10 (which will be hereinafter called merely the "substrate 10" from time to time) by a CVD process, a coating method that applies a $SiO_2$ solution by use of a spinner, etc. The $SiO_2$ film 14 has a thickness sufficient to cover the pattern 12.

Figure 1C:
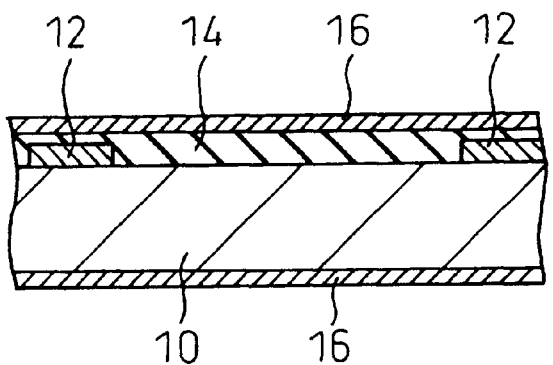

The other side of the silicon substrate 10 is polished to a given thickness of about 50 to about 300 $\mu$m. Next, a nickel (Ni) plating film 16 is formed on the entire surface of the substrate 10 inclusive of the top of the $SiO_2$ film 14 formed on the silicon substrate 10 and the other side of the substrate 10 (FIG. 1C). The Ni plating film 16 can be formed by electroless Ni plating, and electrolytic Ni plating may be further applied, whenever necessary. The thickness of the Ni plating film 16 is preferably from about 0.1 to about 1.0 $\mu$m.

Figure 1D:
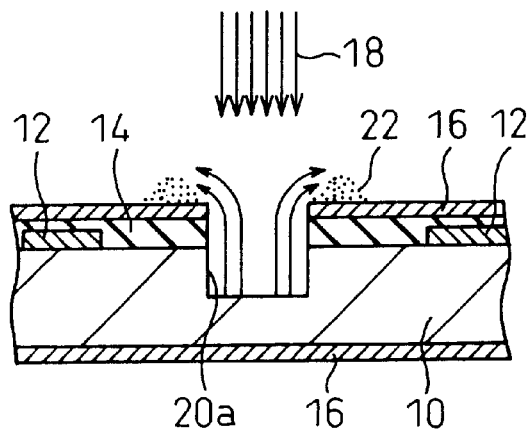

Next, laser beams 18 are irradiated to predetermined positions of the substrate 10 on its conductor formation side to form recess 20a (FIG. 1D). In this instance, the substrate 10 is held by a vacuum onto a stage (not shown) and irradiation of the laser beam 18 is carried out, as explained previously with reference to FIG. 8. A YAG, an excimer, a carbon dioxide laser or the like can be used to generate the laser beam 18.

When the laser beam 18 is thus irradiated to one side of the silicon substrate 10, the Ni plating film 16 and the $SiO_2$ film 14 at the irradiation portion are removed, and silicon (Si) of the substrate 10 is subsequently scattered by energy of the laser beam 18, thereby forming the recess 20a. When the laser beam 18 is consecutively irradiated to the bottom of the recess 20a, the bottom of the recess 20a is scooped out and the recess 20a becomes gradually deeper. Silicon (Si) at the bottom of the recess 20a so scooped out is scattered away as a debris by the energy of the laser beam 18, is deposited on the portion in the proximity of the open periphery of the recess 20a, and forms a deposit (laser dross) 22. The laser dross 22 grows as the recess 20a becomes deeper.

Figure 1E:
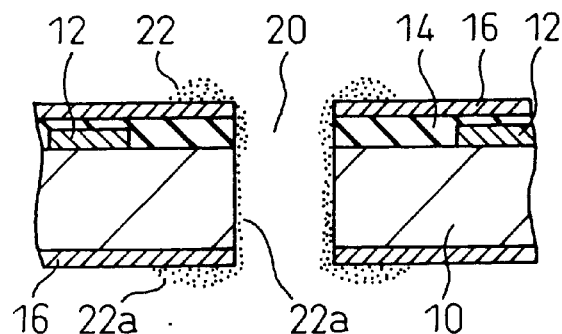

When irradiation of the laser beam 18 to the same position of the one side of the silicon substrate 10 is continued, the recess 20a becomes gradually deeper, and at last the laser beam 18 breaks through the bottom of the recess 20a to thereby create a through-hole 20 (FIG. 1E).

When the laser beam 18 is continuously irradiated in this way until the through-hole 20 is formed, the substrate 10 is heated but the heat is quickly dissipated through the Ni plating film 16. Therefore, the substrate 10 does not accumulate heat to such an extent as to exert a great influence on the conductor pattern 12. The laser dross 22 is formed in the proximity of the open periphery of the through-hole 20 on the one side of the substrate 10, and the deposit or debris 22a is deposited on the inner wall of the through-hole 20 as well as the proximity of its open periphery on the other side of the substrate 10. Such a debris 22a is formed as energy of the laser beam 18 scatters Si at bottom of the recess 20a to form the debris, and this debris is then deposited on the other side of the substrate 10 and on the inner wall of the through-hole 20.

Figure 1F:
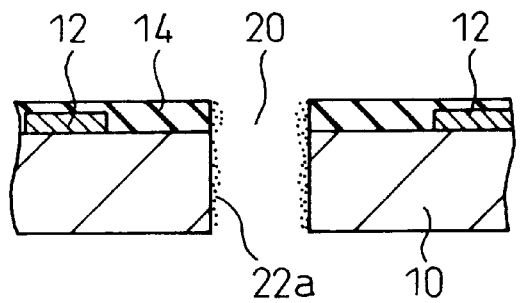

If the laser dross 22 and the debris 22a are left as such, they peel from the substrate 10 in subsequent process steps, turn into foreign matter and are likely to invite the drop of reliability of the product. When the Ni plating film 16 covering the entire surface of the substrate 10 inclusive of the top of the $SiO_2$ film 14 is peeled off, however, the laser dross 22 formed on the one side of the substrate 10 and the debris 22a deposited on the other side of the substrate 10 can be removed together (FIG. 1F). The Ni plating film 16 can be peeled by use of an Ni plating film peeling solution that is ordinarily used in the art.

Figure 1G:
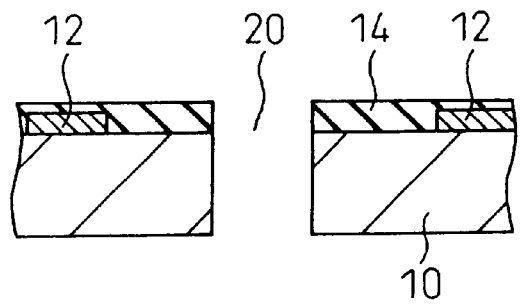

However, the debris 22a deposited on the inner wall surface of the through-hole 20 cannot be sufficiently removed even by the peeling solution for the Ni plating film 16. Therefore, the debris 22a is removed by use of a removing solution for the removal of the debris 22a on the other side of the substrate 10, such as a caustic potash (KOH) solution. In consequence, a clean through-hole 20 can be formed (FIG. 1G). When the substrate 10 is immersed in such a removing solution, the conductor pattern 12 is not damaged because the $SiO_2$ film 14, as the protective film, protects it. The $SiO_2$ film 14 need not be peeled because it can be utilized as an insulating film in subsequent process steps.

Figure 1H:
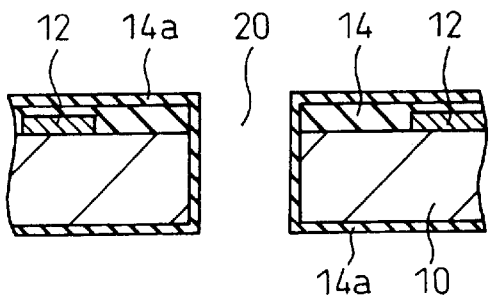
Figure 1I:
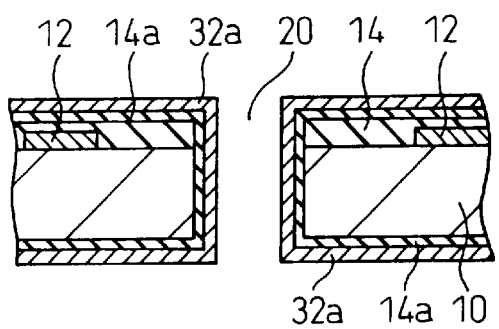
Figure 1J:
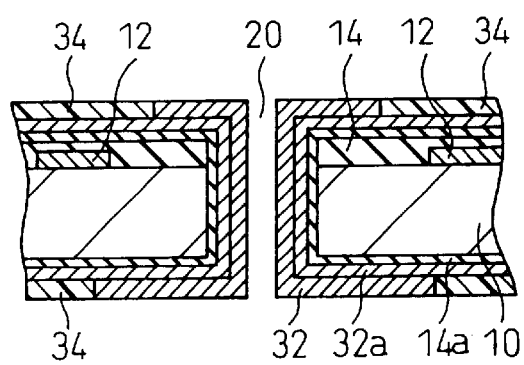

To form the clean through-hole 20 created in this way in the substrate into a via, another $SiO_2$ film 14a thinner than the $SiO_2$ film 14 is formed on the entire surface of the substrate 10 inclusive of the inner wall surface of the through-hole 20 and the surface of the $SiO_2$ film 14 by means such as CVD (FIG. 1H). Further, electroless copper plating is applied to the surface of the $SiO_2$ film 14a to form a thin copper film 32a (FIG. 1I). Next, a resist pattern 34 is formed on the thin copper film 32a, after which electroplating of copper is carried out by using the resist pattern 34 as a mask and the thin copper film 32a as a power feed layer so as to form a copper layer 32 on the inner wall surface of the through-hole 20 and on both sides of the silicon substrate 10, to thereby form a through-hole-via and a conductor pattern (FIG. 1J).

Figure 1K:
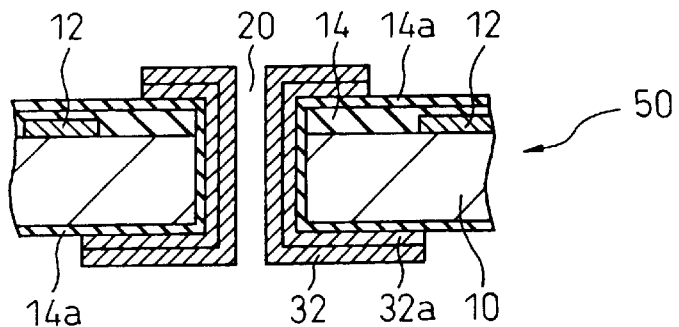

The resist pattern 34 is thereafter removed, and the exposed copper film 32a is etched away. There is thus obtained the silicon substrate 50 having the through-hole-via formed therein and the conductor pattern formed thereon (FIG. 1K).

Figure 2:
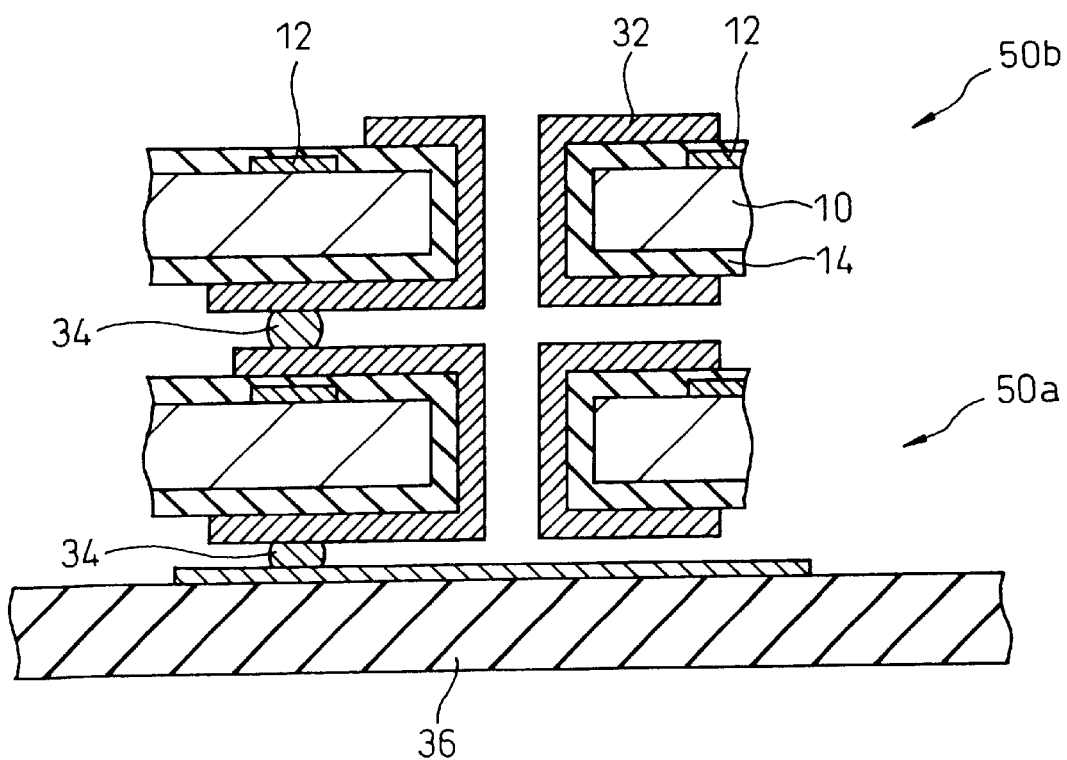
FIG. 2 illustrates a three-dimensional MCP formed by use of a plurality of silicon substrates having through-hole via and a conductor pattern formed.

A plurality of silicon substrates 50a, 50b each having the through-hole-via and the conductor pattern are stacked with one another in such a manner that bumps 34 made of solder or gold are sandwiched between the substrates 50a, 50b and between the lowermost silicon substrate 50a and a mounting substrate 36 to establish electric connections among them, to thereby provide a three-dimensional multi-chip package (MCP), as shown in FIG. 2.

The method described above forms the through-hole-via by means of plating, but the via may be formed by filling an electrically conductive paste into the hole 20.

Figure 8:
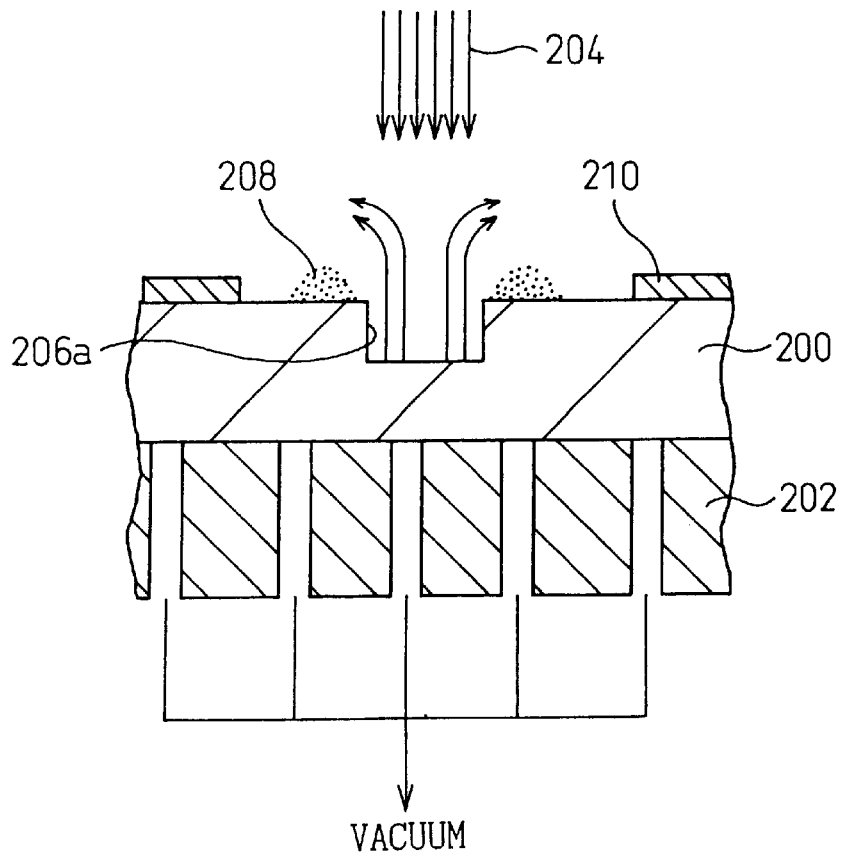
FIG. 8 illustrates a prior method of forming through-holes in a silicon substrate by irradiation of laser beam.
Figure 9:
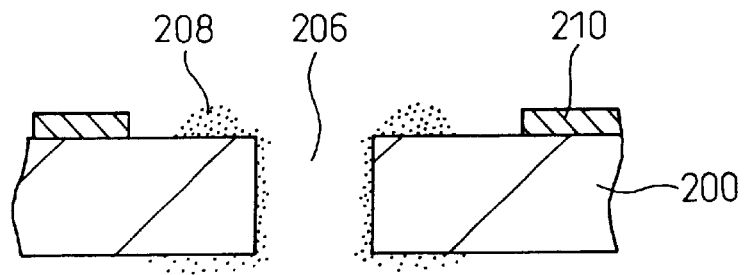
FIG. 9 illustrates a through-hole that is formed by the prior method shown in FIG. 8.

Referring again to FIG. 1E, the debris 22a is also deposited on the portion in the proximity of the open periphery of the through-hole 20 on the other side of the substrate 10, when the through-hole 20 is formed, as shown in the drawing. This phenomenon occurs when the substrate 10 is held by a vacuum on a stage and the laser beam 18 is irradiated onto the substrate 10, as shown in FIG. 8. More specifically, when the laser beam 18 breaks through the bottom of the recess 20a and creates the through-hole 20 opening to the other side of the substrate 10, the debris generated by the irradiation of the laser beam 18 to the bottom of the recess 20a is reflected by the surface of the stage and is deposited on the other side of the substrate 10.

The deposition of the debris to the other side of the substrate 10 can be prevented if a stage equipped with debris reflection-prevention means is used as the stage for supporting thereon the substrate 10. A stage 24 having a space portion 26, which is defined by the inner wall of a hole piercing through the stage at a position corresponding to the formation position of the through-hole in the silicon substrate 10, as shown in FIG. 3, can be used as the stage equipped with the debris reflection-prevention means. By putting the substrate 10 on such a stage 24 and irradiating the laser beam 18 to the predetermined position of the substrate 10 corresponding to the space portion 26 of the stage 24 to form the through-hole 20, the debris inside the recess 20a is blown into the space portion 26 of the stage 24 and is prevented from being deposited to the other side of the substrate 10, when the laser beams 18 breaks the bottom of the recess portion 20a.

To form a plurality of through-holes 20 in the substrate 10, deposition of the debris to the other side of the substrate 10 can be prevented as much as possible by use of a stage having debris reflection-prevention means that is equipped with a driver unit 42 for moving the substrate 10 along the upper surface of the stage 24, and with a controller unit 44 for controlling the driver unit 42 and moving the substrate 10 in such a fashion that the formation position of each of the through-holes 20 in the substrate 10 coincides with the space portion 26 of the stage 24. When the formation position of each through-hole 20 in the substrate 10 coincides with the space portion 26 of the stage 24, a small holes 25 formed in the stage 24 are connected to a vacuum so as to suck the substrate 10 to the stage, and the laser beam 18 is then irradiated to form the through-hole 20.

In the case of the formation of a plurality of through-holes, when a new through-hole is formed in the proximity of the through-hole 20 that has already been formed, the debris scattered by the irradiation of the laser beam 18 can enter the through-hole 20 that has already been formed. In such a case, after all the through-holes 20 is formed, the laser beam 18 can be again irradiated into each of the through-holes 20 to remove the debris entering the through-holes 20, which can make cleaning after the formation of the through-holes 20 easy.

Figure 4A:
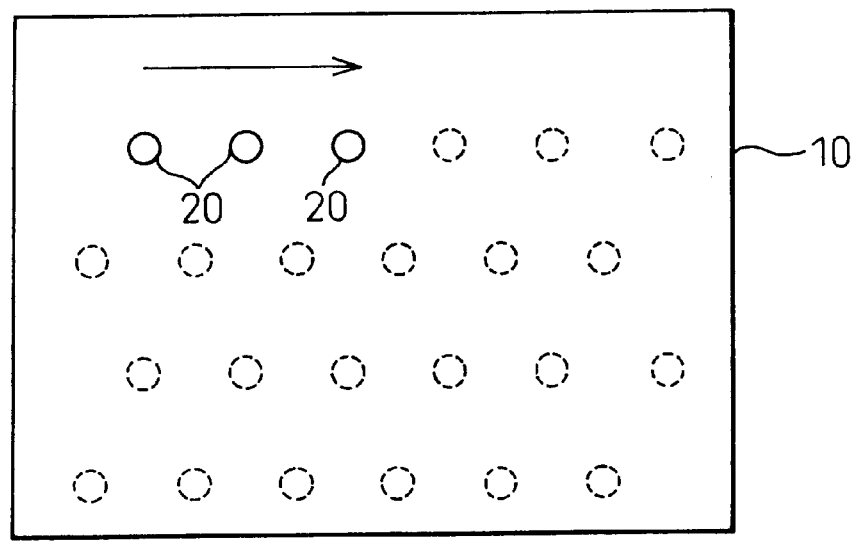
FIGS. 4A and 4B illustrate still another embodiment of the method of forming through-holes in a silicon substrate.

Referring to FIG. 4A, if a plurality of through-holes 20 are serially formed in the same direction (direction indicated by the arrow in FIG. 4A) when the through-holes are formed by the irradiation of the laser beam, heat is built up in some cases inside the substrate 10 even though the substrate 10 is covered with an Ni plating film to improve its heat dissipation property.

Figure 4B:
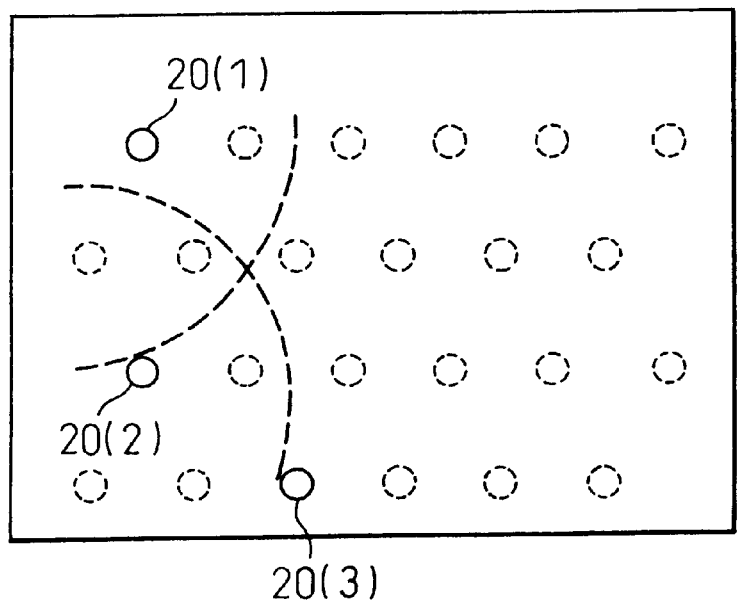

In such a case, a first through-hole 20(1) is formed in the substrate 10 through the irradiation of the laser beam, as shown in FIG. 4B. Next, a second through-hole 20(2) is formed at a position that is not substantially affected by heat built up in the substrate 10 during the formation of the first through-hoe 20(1). The broken lines in FIG. 4B respectively represent the extents to which the influences of heat due to the formation of the through-holes 20(1) and 20(2) spread. The problem of heat accumulation in the substrate 10 can be prevented when a next through-hole is formed at a position that is substantially free from the influences of heat of the through-holes formed previously.

When it is necessary to form a next through-hole at a position that is substantially affected by the influences of heat of the through-hole formed previously, the start of the formation of the next through-hole is preferably retarded until heat of the through-hole 20 previously formed is dissipated.

In the embodiment explained with reference to FIGS. 1, 3 and 4, the through-hole 20 is formed by irradiating the laser beam 18 to one side (conductor pattern formation side) of the substrate having the conductor pattern 12 formed thereon. Therefore, the laser dross 22 is formed on the conductor pattern formation side of the substrate 10, and this side is contaminated much more than the other side of the substrate 10 on which the debris 22a is deposited. The laser dross 22 formed on the pattern formation side of the substrate 10 is removed when the Ni plating film 16 is peeled, but the portion in the proximity of the open periphery of the through-hole 20 having the laser dross 22 formed thereon is likely to be contaminated much more than the other portions.

Figure 5A:
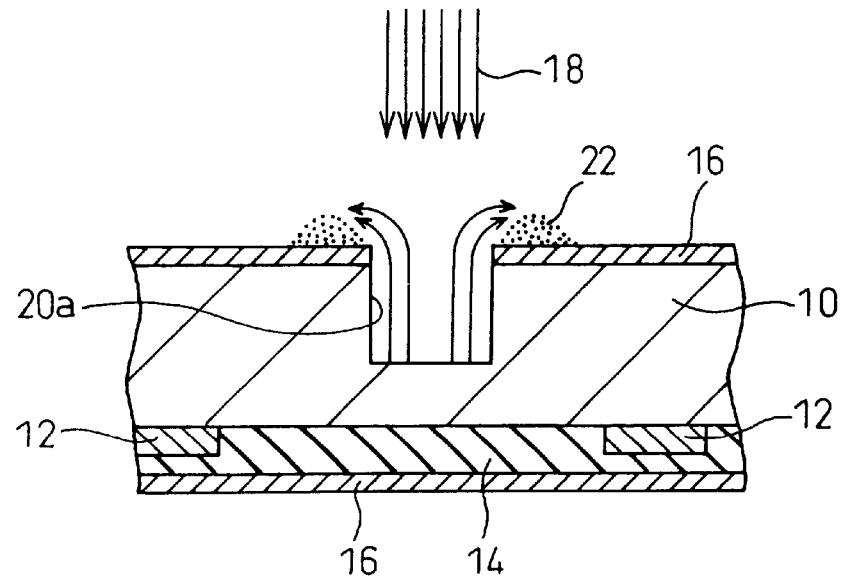
FIGS. 5A and 5B illustrate a further embodiment of the method of forming through-holes in a silicon substrate.

As shown in FIG. 5A, the through-hole can be formed in the substrate 10 without forming the laser dross 22 on the pattern formation side of the substrate 10 by irradiating the laser beam 18 to the other side of the substrate 10 on which the conductor pattern 12 is not formed. When the laser beams 18 are irradiated in this way to the other side of the substrate 10 not having the pattern 12 formed thereon to form the through-hole, the influence of heat on the pattern 12 formed on the pattern formation side of the substrate can also be mitigated.

Figure 5B:
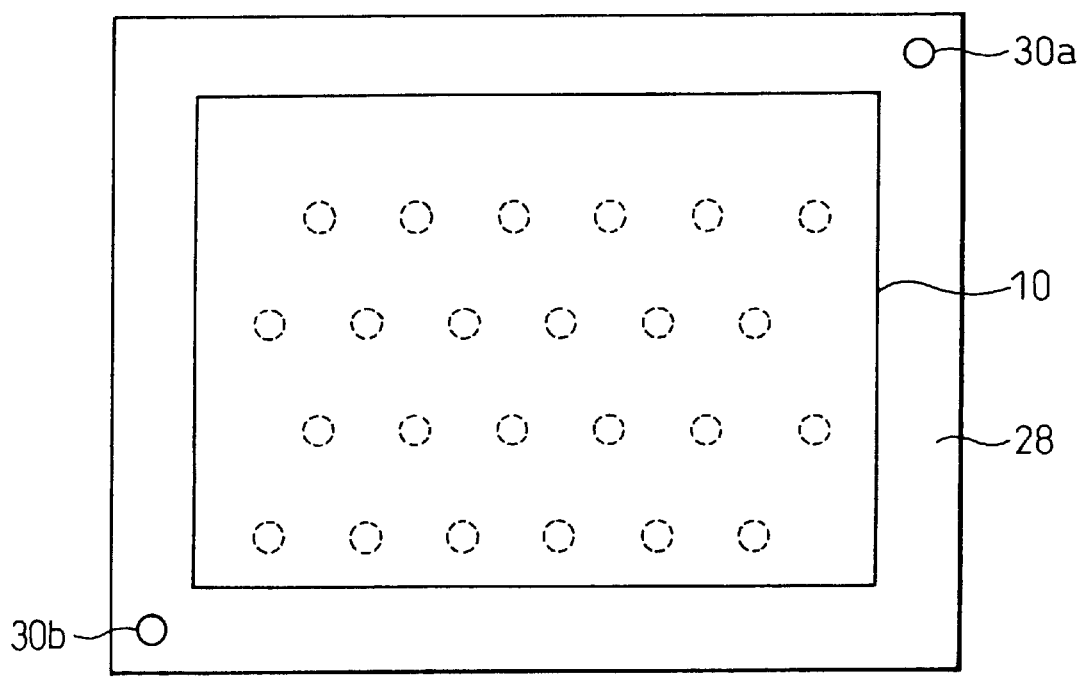

To irradiate the laser beam 18 from the other side of the substrate 10 and to form the through-hole opening at a predetermined position of the pattern formation side of the substrate 10, positioning for the formation of the through-hole must be carried out on the other side of the substrate 10. It is therefore preferred to form through-holes 30a, 30b for the positioning on a frame member 28 surrounding the portion of the substrate 10 and later separated from it to leave the substrate 10, at the predetermined locations of the side thereof corresponding to the side of the substrate 10 to which the laser beam 18 is to be irradiated, as shown in FIG. 5B. By the use of such positioning through-holes 30a, 30b, the positions at which the through-holes 20 are to be formed can also be set immediately below the laser beam irradiation portion at the other side of the substrate 10.

When the laser beam 18 is irradiated to the other side of the substrate 10 and through-holes opening at predetermined positions of the pattern formation side of the substrate 10 are formed, as shown in FIG. 5A, it is also preferred to use the stage 24 having the space portion 26 as the debris reflection-prevention means at position corresponding to the formation position of the through-hole in the substrate 10, as shown in FIG. 3.

Also in this case, a plurality of through-holes 20 can be efficiently formed by using a debris reflection-prevention means having a driver unit 42 for moving the substrate 10 along the stage 24 and a controller unit 44 for controlling the driver unit 42 and moving the substrate 10 in such a fashion that the formation position of the each of through-holes 20 in the substrate 10 can be brought into conformity with the space portion 26 of the stage 24.

Although the formation of the through-holes 20 has thus been described with reference to FIGS. 1 to 5, the invention can also be applied to the formation of a recess in the substrate 10.

Figure 6A:
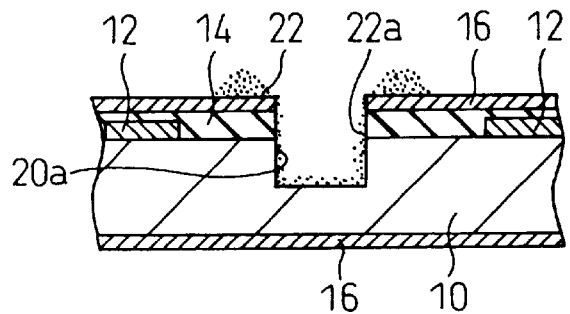
FIGS. 6A to 6C illustrate the method of forming recesses in a silicon substrate according to the invention.
Figure 6B:
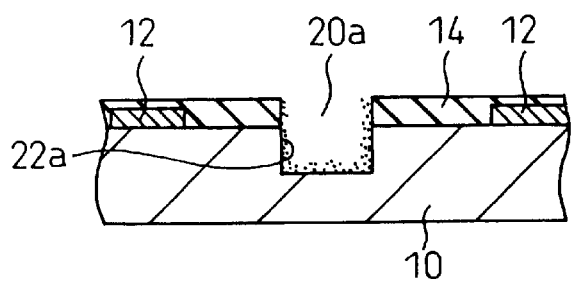
Figure 6C:
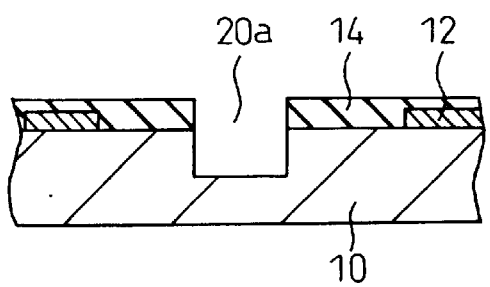
Figure 7:
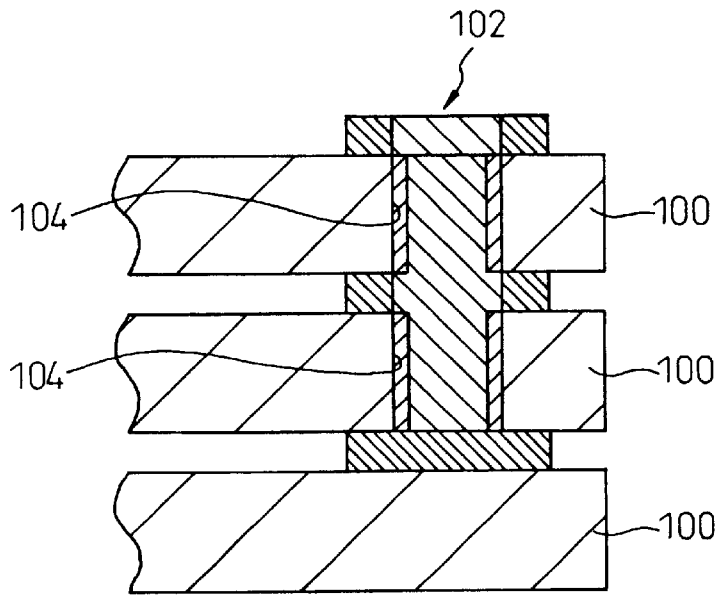
FIG. 7 schematically shows a three-dimensional MCP.

More specifically, the laser beam 18 is irradiated to one side of the substrate 10, as shown in FIG. 1D, and the irradiation of the laser beam 18 is stopped at the point at which a recess 20a having a predetermined depth is formed. In this way, the recess 20a can be formed in the substrate 10, as shown in FIG. 6A. However, the laser dross 22 is formed in the proximity of the open periphery of the recess 20a so formed, and the debris 22a is deposited to the inner wall surface and the bottom of the recess 20a. The laser dross 22 formed in the proximity of the open periphery of the recess portion 20a can be removed by immersing the substrate 10 into an Ni plating film peeling solution and peeling the Ni plating film 16 (FIG. 6B). The debris 22a deposited to the inner wall surface and the bottom of the recess 20a can be removed by, after the removal of the laser dross 22, immersing the substrate 10 into a removing solution for the laser dross 22, such as a caustic potash (KOH) solution, to provide a clean recess 20a (FIG. 6C).

In any of the embodiments of the invention described above, it is possible to use a silicon nitride film, a diamond-like carbon film or a resin film, such as a polyimide film, in place of the $SiO_2$ film 14 as the protective film. Copper (Cu) or aluminum (Al) can be used as the metal plating film material besides nickel.

When the through-hole or the recess is formed in the silicon substrate through the irradiation of a laser beam, the invention can improve the heat dissipation property of the silicon substrate during processing, can easily clean the deposit at the open periphery of the through-hole formed and the debris on the inner wall of the hole or recess, and can form a clean through-hole or recess. As a result, the invention can form a clean through-hole or recess in the silicon substrate by use of laser processing that is more economical than plasma processing, and can easily fabricate a three-dimensional MCP by stacking a plurality of semiconductor chips in a direction of thickness, for example.

What is claimed is:

1. A method of forming a through-hole or a recess in a silicon substrate having a conductor pattern formed on one side thereof by irradiating laser beam to the silicon substrate, comprising the steps of:

forming a protective film for protecting the conductor pattern on the one side of the silicon substrate, forming, on the entire surface of the silicon substrate inclusive of the top of the protective film, a metal plating film adhered to the protective film, irradiating a laser beam to a predetermined position of the silicon substrate covered with the protective film and with the metal plating film, to form a through-hole or a recess in the silicon substrate, peeling the metal plating film and removing debris on the metal plating film around the open periphery of the through-hole or the recess, which has been deposited thereon during the formation of the thorough-hole or the recess by the laser beam irradiation, and removing a deposit on the inner wall of the thorough-hole or the recess, which has been deposited thereon during the formation of the thorough-hole or the recess by the laser beam irradiation, by use of a removing solution not damaging the protective film.

2. The method of claim 1, wherein the protective film is formed of silicon oxide, silicon nitride, diamond-like carbon, or a resin.

3. The method of claim 1, wherein the protective film is formed of silicon oxide.

4. The method of claim 1, wherein the metal plating film is formed of nickel, copper or aluminum.

5. The method of claim 1, wherein the metal plating film is formed of nickel.

6. The method of claim 1, wherein the deposit on the inner wall of the thorough-hole or the recess is removed by a solution of KOH, NaOH or HF.

7. The method of claim 1, wherein the deposit on the inner wall of the thorough-hole or the recess is removed by a solution of KOH.

8. The method of claim 1 wherein, in the case of the formation of a plurality of through-holes or recesses in the silicon substrate, following the formation of a previous through-hole or recess, a subsequent through-hole or recess is formed at a location of the substrate, the location being selected so that heat generated by the irradiation of the laser beam to the substrate for the formation of the previous through-hole or recess is not substantially accumulated in the substrate during the formation of the subsequent through-hole or recess.

9. The method of claim 1, wherein in the case of the formation of a plurality of through-holes or recesses in the silicon substrate, following the formation of a previous through-hole or recess, a subsequent through-hole or recess is formed at a time interval between the formations of the previous and subsequent through-holes or recesses, the time interval being selected so that heat generated by the irradiation of the laser beam to the substrate for the formation of the previous through-hole or recess is not substantially accumulated in the substrate during the formation of the subsequent through-hole or recess.

10. The method of claim 1 wherein, to prevent the debris from being reflected by the surface of a stage, on which the silicon substrate is positioned for the formation of the through-hole, and from depositing on the silicon substrate, at the time when the laser beam penetrates through the silicon substrate to create the through-hole, a stage having debris reflection-prevention means is used.

11. The method according to claim 10, wherein the stage has a hole piercing through it at a location thereof at which the through-hole is to be created.

12. The method of claim 1 wherein, after the formation of a plurality of through-holes, the deposit within the formed through-holes is removed by irradiating the laser beam into the respective through-holes.

13. The method of claim 1 wherein, in the case of the formation of the through-hole, the laser beam is irradiated from the other side of the silicon substrate, not having the conductor pattern, to form the through-hole.

* * * * *